United States Patent
Peng et al.

(10) Patent No.: US 9,711,619 B1
(45) Date of Patent: Jul. 18, 2017

(54) STRESS MEMORIZATION AND DEFECT SUPPRESSION TECHNIQUES FOR NMOS TRANSISTOR DEVICES

(71) Applicant: GLOBALFOUNDRIES Inc., Grand Cayman (KY)

(72) Inventors: Wen-Pin Peng, Clifton Park, NY (US); Min-hwa Chi, San Jose, CA (US)

(73) Assignee: GLOBALFOUNDRIES Inc., Grand Cayman ( * ) Notice: Subject to any disclaimer, the term of this patent is extended or adjusted under 35 U.S.C. 154(b) by 0 days.

(21) Appl. No.: 15/000,111

(22) Filed: Jan. 19, 2016

(51) Int. Cl.
 *H01L 29/66* (2006.01)
 *H01L 21/225* (2006.01)
 *H01L 21/324* (2006.01)

(52) U.S. Cl.
 CPC .... *H01L 29/66636* (2013.01); *H01L 21/2253* (2013.01); *H01L 21/324* (2013.01); *H01L 29/66659* (2013.01)

(58) Field of Classification Search
 CPC ............. H01L 29/7848; H01L 29/7842; H01L 29/7847; H01L 29/66636; H01L 21/823814; H01L 21/324; H01L 21/34; H01L 21/38; H01L 21/425; H01L 29/66568
 See application file for complete search history.

(56) References Cited

U.S. PATENT DOCUMENTS

| | | | |
|---|---|---|---|
| 8,003,472 B2* | 8/2011 | Iwasa | H01L 21/823437 257/E21.409 |
| 8,343,825 B2 | 1/2013 | Domenicucci et al. | |
| 8,716,090 B2* | 5/2014 | Qin | H01L 29/6653 257/408 |
| 9,087,741 B2* | 7/2015 | Cheng | H01L 21/823814 |
| 2012/0184075 A1* | 7/2012 | Domenicucci | H01L 21/26506 438/166 |
| 2014/0159124 A1* | 6/2014 | Doris | H01L 29/6653 257/288 |

(Continued)

OTHER PUBLICATIONS

Y. Liu, et.al. "Strained Si Channel MOSFETs with Embedded Silicon Carbon Formed by Solid Phase Epitaxy", Symp on VLSI Technology, p. 44, 2007.

(Continued)

*Primary Examiner* — Scott B Geyer
(74) *Attorney, Agent, or Firm* — Heslin Rothenberg Farley & Mesiti P.C.; Nathan B. Davis

(57) ABSTRACT

In one illustrative embodiment, the present disclosure is directed to a method involving fabricating an NMOS transistor device having a substrate and a gate structure disposed over the substrate, the substrate including a channel region underlying, at least partially, the gate structure, the fabricating including: forming a source and drain cavity in the substrate; with an in situ doped semiconductor material, epitaxially growing a source and drain region within the source and drain cavity; performing an amorphization ion implantation process by implanting an amorphization ion material into the source and drain region; forming a capping material layer above the NMOS transistor device; with the capping material layer in position, performing a stress forming anneal process to thereby form stacking faults in the source and drain region; and removing the capping material layer.

5 Claims, 15 Drawing Sheets

(56) References Cited

U.S. PATENT DOCUMENTS

2014/0291759 A1* 10/2014 Zhao ................. H01L 29/66598
257/336
2014/0312428 A1* 10/2014 Adam ............. H01L 21/823807
257/369

OTHER PUBLICATIONS

S. M. Pandey, et.al., "Mechanism of SMT and Method to Maximize Its Effect", IEEE EDL, v32, No. 4, p. 467, 2011.

* cited by examiner

STRESS MEMORIZATION AND DEFECT SUPPRESSION TECHNIQUES FOR NMOS TRANSISTOR DEVICES

FIELD OF THE INVENTION

The present disclosure generally relates to semiconductor devices and to various stress memorization and defect suppression techniques that may be employed when manufacturing NMOS transistor devices.

BACKGROUND OF THE INVENTION

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NMOS and PMOS transistors) represent one important type of circuit element used in manufacturing such integrated circuit devices. A field effect transistor, irrespective of whether an NMOS transistor or a PMOS transistor is considered, typically includes doped source and drain regions that are formed in a semiconducting substrate that are separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

Device designers are under constant pressure to increase the operating speed and electrical performance of transistors and integrated circuit products that employ such transistors. Given that the gate length (the distance between the source and drain regions) on current generation transistor devices may be approximately 20-50 nm, and that further scaling is anticipated in the future, device designers have employed a variety of techniques in an effort to improve device performance, e.g., the use of high-k dielectrics, the use of metal gate electrode structures, the incorporation of work function metals in the gate electrode structure, etc. Another technique that device designers have employed to improve device performance is to induce a desired stress in the channel region of a device, i.e., induce a tensile stress in the channel region of an NMOS device (to improve the mobility of charge-carrying electrons) and induce a compressive stress in the channel region of a PMOS device (to improve the mobility of charge-carrying holes). Various stress-memorization techniques are known to those skilled in the art.

One typical prior art process flow that is performed to form NMOS transistors with the desired tensile stress in a CMOS application is as follows. After the gate structures are formed, N-type extension and halo implants are formed for the N-type devices with the P-type devices masked, followed by extension and halo implants on the P-type devices with the N-type devices masked, a spacer is formed on the P-type devices, a cavity is etched in the source/drain regions of the P-type devices and an epi semiconductor material is formed in the cavities on the P-type devices. Next, a so-called SMT (Stress Memorization Technique) processing module is performed on the N-type device. A spacer is formed on the N-type devices and an amorphization implant process is performed using a material such as germanium to amorphize the source/drain region (e.g., using germanium at about 55 keV, 3 $e^{14}$ ion/cm$^2$ dose). Thereafter, the SMT module involves forming a layer of silicon dioxide (e.g., about 4 nm thick) on the substrate, forming a capping material layer, e.g., a thick layer of silicon nitride (e.g., about 40 nm thick) with the desired intrinsic stress, and heating the device for about 10 minutes at 750° C. in a nitrogen environment. Thereafter, the layer of silicon nitride and the layer of silicon dioxide are removed by performing one or more etching processes. Then, raised source/drain regions are formed on the N-type devices by depositing epi semiconductor material in the source/drain areas of the device. Thereafter, source/drain implant regions are formed by performing an ion implantation process. A heating process is later performed to repair damage to the lattice structure of the substrate due to the amorphization implant process and the other ion implantation processes that were performed on the substrate up to this point in the process flow.

Prior art stress memorization techniques have a number of shortcomings, such as generation of stacking faults that grow deeper than the depth of the source and drain region and/or generation of stacking faults that extend into the channel region.

Prior art discloses use of carbon implantation into amorphized regions of the source and drain region as disclosed in U.S. Pat. No. 8,343,825, "Reducing dislocation formation in semiconductor devices through targeted carbon implantation". The implanted carbon pins partial dislocations so as to prevent the dislocations from disassociating from the ends of the stacking faults and moving to the channel region.

Prior art stress memorization techniques are laborious, requiring placement and removal of masks before and after each processing step.

As discussed above, prior art processes involve formation of the stacking faults with the stress memorization technique, followed by subsequent formation of the source and drain region. The subsequent formation of the source and drain region can relax the stress generated in the stress memorization technique. The subsequent formation of the source and drain region may also result in forming of defects in the stacking faults and/or propagation of stacking faults, such as propagation toward the channel region or through the source and drain region into the underlying substrate. This leads to degradation of stress. Leakage, bad Vtmm and more variation in the NMOS device parameters, such as Vt.

Prior art stress memorization techniques also have a shortcoming of not forming stacking faults when the LOD (Length of Diffusion—the dimension between the edge of the gate structure at issue and the edge of the active region) is small. Thus, the stacking faults often do not form when they have to be located adjacent the free surface of the active region, i.e., the interface between the active region and the isolation material. FIG. 1 is a TEM photograph of an integrated circuit product 10 that includes a plurality of NMOS transistors formed above an active region 11 defined in a semiconductor substrate by an illustrative isolation region 16. As depicted, the transistors include a gate electrode structure 12 and raised source/drain regions 13. Ideally, by performing stress memorization techniques, stacking faults 14 (sometimes referred to as edge dislocations within the industry) will be formed in the active region 11 underneath the raised source/drain areas 13 of the devices. Ideally, for current generation devices with very small gate lengths and very tight gate spacing (pitch), the stacking faults 14 will have an inverted "V" shaped configuration, as depicted in the dashed-line region 15, for a [100] substrate. The stacking faults 14 may have a configuration other than the depicted inverted "V" for devices formed on substrates other than a [100] substrate, i.e., the angle of the downward-pointing "legs" of the inverted "V" shaped stacking faults 14 may be different when the substrate has a different crystallographic orientation. In some applications, the dislocations may not even intersect one another, i.e., the stacking faults may not intersect one another so as to form the "apex" of the inverted "V" shaped stacking faults. Thus, the above reference to the stacking faults 14 having an inverted "V" shaped configuration is only a shorthand reference. However, with respect to the transistors formed adjacent the edge of the isolation region 16 (i.e., when the LOD is small), such stacking faults 14 do not form in the source/drain regions of the device, as reflected by the absence of such stacking faults 14 in the dashed-line regions 17. The lack of the stacking faults 14 indicates that the particular transistor device did not receive any significant benefit from performing the process operations associated with the SMT module, i.e., the source/drain regions of such NMOS devices do not have the desired stacking faults 14. Accordingly, the transistors where the stacking faults 14 are absent, or at least not fully formed, will not perform as well as a transistor device where the stacking faults 14 are present, as depicted in the dashed line region 15 shown in FIG. 1. This can also lead to across wafer device performance variability. Some attempts have been made to use hydrogen-rich silicon nitride as the stress-inducing material layers and/or fluorine implant for SMT amorphization to improve the formation of the desired stacking faults 14. High junction leakage is another issue that is prevalent with typical prior art SMT processes.

The present disclosure is directed to various stress memorization techniques that reduce or eliminate one or more of the problems identified above.

SUMMARY OF THE INVENTION

The following presents a simplified summary of the disclosure in order to provide a basic understanding of some aspects of the disclosure. This summary is not an exhaustive overview. Its sole purpose is to present some concepts in a simplified form as a prelude to the more detailed description that is discussed later.

Generally, the present disclosure is directed to various stress memorization techniques that may be employed when manufacturing transistor devices.

The methods disclosed herein reverse the prior art processing steps by firstly forming source and drain regions and then subsequently performing a stress memorization technique. As a result, the stacking faults generated by the stress memorization technique are not relaxed. In addition, carbon is introduced in source and drain forming steps, e.g., carbon implant with n+ doping ion implantation, or by Si-epi growth with in-situ C and P doing, so that stacking faults generated in subsequent stress memorization technique step do not propagate toward the channel region or through junction interface.

Our new methods described herein have a number of advantages. The stress generated in the stress memorization technique is not relaxed and stacking faults generated in stress memorization technique step do not propagate toward the channel region or through junction interface. Furthermore, the n+ dopants, such as arsenic and/or phosphorus are also suppressed in diffusion and preserved within the source and drain region, thus preventing a need for heavy Halo implant dose (as punch-through suppression) and leading for better Vtmm. Moreover, the source and drain region formation process and the stress memorization technique can be merged by using a single RTA anneal for creation of stacking faults and for dopant activation. Our methods also utilize fewer processing steps, thus reducing the number of masks that have to be used.

Thus, in one embodiment, the present disclosure is directed to a method which includes: fabricating an NMOS transistor device which includes a substrate and a gate structure disposed over the substrate, the substrate including a channel region underlying, at least partially, the gate structure, the fabricating including:

forming a source and drain cavity in the substrate, wherein the source and drain cavity is separated by the channel region;

epitaxially growing a source and drain region within the source and drain cavity;

performing a source and drain ion implantation process by implanting a source and drain dopant material into the source and drain region and performing a carbon implantation process by implanting carbon into the source and drain region; wherein the source and drain ion implantation process and the carbon implantation process are performed sequentially or concurrently;

performing an amorphization ion implantation process by implanting an amorphization ion material into the source and drain region;

forming a capping material layer above the NMOS transistor device;

with the capping material layer in position, performing a multipurpose anneal process to thereby activate the source and drain dopant material and to form stacking faults in the source and drain region; and removing the capping material layer.

In another embodiment, the present disclosure is directed to a method which includes: fabricating an NMOS transistor device which includes a substrate and a gate structure disposed over the substrate, the substrate including a channel region underlying, at least partially, the gate structure, the fabricating including:

performing a source and drain ion implantation process by implanting a source and drain dopant material into a source and drain region, wherein the source and drain region is separated by the channel region, and performing a carbon implantation process by implanting carbon into the source and drain region; wherein the source and drain ion implantation process and the carbon implantation process are performed sequentially or concurrently;

performing an amorphization ion implantation process by implanting an amorphization ion material into the source and drain region;

forming a capping material layer above the NMOS transistor device;

with the capping material layer in position, performing a multipurpose anneal process to thereby activate the source and drain dopant material and to form stacking faults in the source and drain region; and removing the capping material layer.

In another embodiment, the present disclosure is directed to a method which includes: fabricating an NMOS transistor device which includes a substrate and a gate structure disposed over the substrate, the substrate including a channel region underlying, at least partially, the gate structure, the fabricating c including:

forming a source and drain cavity in the substrate, wherein the source and drain cavity is separated by the channel region;

epitaxially growing a source and drain region within the source and drain cavity;

performing a source and drain ion implantation process by implanting a source and drain dopant material into the source and drain region and performing a carbon implantation process by implanting carbon into the source and drain region; wherein the source and drain ion implantation process and the carbon implantation process are performed sequentially or concurrently;

performing a source and drain activation anneal process to activate the source and drain dopant material;

performing an amorphization ion implantation process by implanting an amorphization ion material into the source and drain region;

forming a capping material layer above the NMOS transistor device;

with the capping material layer in position, performing a stress forming anneal process to thereby form stacking faults in the source and drain region; and removing the capping material layer.

In another embodiment, the present disclosure is directed to a method which includes: fabricating an NMOS transistor device which includes a substrate and a gate structure disposed over the substrate, the substrate including a channel region underlying, at least partially, the gate structure, the fabricating including:

performing a source and drain ion implantation process by implanting a source and drain dopant material into a source and drain region, wherein the source and drain region is separated by the channel region, and performing a carbon implantation process by implanting carbon into the source and drain region; wherein the source and drain ion implantation process and the carbon implantation process are performed sequentially or concurrently;

performing a source and drain activation anneal process to activate the source and drain dopant material;

performing an amorphization ion implantation process by implanting an amorphization ion material into the source and drain region;

forming a capping material layer above the NMOS transistor device;

with the capping material layer in position, performing a stress forming anneal process to thereby form stacking faults in the source and drain region; and removing the capping material layer.

In yet another embodiment, the present disclosure is directed to a method which includes: fabricating an NMOS transistor device which includes a substrate and a gate structure disposed over the substrate, the substrate including a channel region underlying, at least partially, the gate structure, the fabricating including:

forming a source and drain cavity in the substrate, wherein the source and drain cavity is separated by the channel region;

with an in situ doped semiconductor material, epitaxially growing a source and drain region within the source and drain cavity;

performing an amorphization ion implantation process by implanting an amorphization ion material into the source and drain region;

forming a capping material layer above the NMOS transistor device;

with the capping material layer in position, performing a stress forming anneal process to thereby form stacking faults in the source and drain region; and removing the capping material layer.

BRIEF DESCRIPTION OF THE DRAWINGS

The disclosure may be understood by reference to the following description taken in conjunction with the accompanying drawings, in which like reference numerals identify like elements, and in which.

Figure 1:
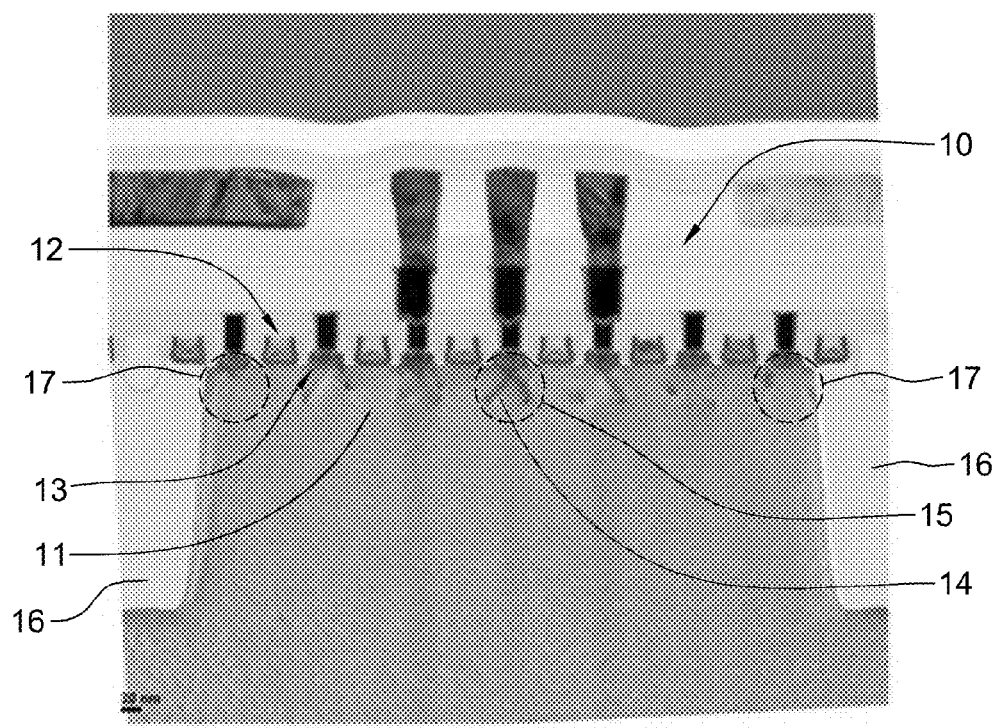
FIG. 1 depicts a TEM photograph of a prior art device wherein stacking faults have been formed in the source/drain regions of some of the transistor devices shown therein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the disclosure to the particular forms disclosed, but on the contrary, the intention is to cover all modifications, equivalents, and alternatives falling within the spirit and scope of the disclosure as defined by the appended claims.

DETAILED DESCRIPTION OF THE INVENTION

Certain terms are used throughout the disclosure to refer to particular components. However, different entities may refer to a component by different names. This document does not intend to distinguish between components that differ in name but not function. The terms "including" and "comprising" are used herein in open-ended fashion, and thus mean "including, but not limited to."

The singular forms "a", "an", and "the" include plural referents unless the context clearly dictates otherwise.

Approximating language, as used herein throughout the specification and claims, may be applied to modify any quantitative representation that could permissibly vary without resulting in a change in the basic function to which it is related. Accordingly, a value modified by a term or terms, such as "about", is not to be limited to the precise value specified. In some instances, the approximating language may correspond to the precision of an instrument for measuring the value.

The present subject matter will now be described with reference to the attached figures. Various structures, systems, and devices are schematically depicted in the drawings for purposes of explanation only. The attached drawings are included to describe and explain illustrative examples of the present disclosure. The words and phrases used herein should be understood and interpreted to have a meaning consistent with the understanding of those words and phrases by those in the industry. No special definition of a term or phrase, i.e., a definition that is different from the ordinary and customary meaning as understood by those in the industry, is intended to be implied by consistent usage of the term or phrase herein. To the extent that a term or phrase is intended to have a special meaning, such a special definition will be expressly set forth in the specification in a definitional manner that directly and unequivocally provides the special definition for the term or phrase.

The present disclosure is directed to various stress memorization techniques that may be employed when manufacturing transistor devices. As will be readily apparent, the present method is applicable to a variety of devices, including, but not limited to, logic devices, memory devices, etc., and the methods disclosed herein may be employed to form N-type or P-type semiconductor devices. Additionally, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the devices disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

Figure 2A:
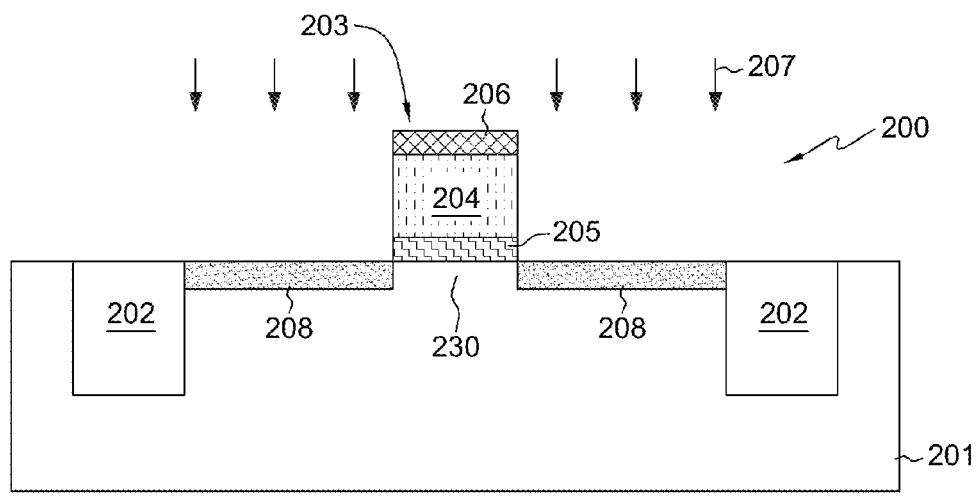
FIGS. 2A-2B depict, in idealized cross-section, various aspects of forming extension implant regions.

FIGS. 2A-7F depict various illustrative embodiments of stress memorization techniques disclosed herein that may be employed when manufacturing transistor devices. FIG. 2A is a simplified view of an illustrative NMOS transistor 200 at an early stage of manufacturing. The transistor 200 is formed in and above an active region of a semiconductor substrate 201 that is defined by an illustrative trench isolation structure 202 formed in the substrate 201. The substrate 201 may have a variety of configurations, such as the depicted bulk silicon configuration. The substrate 201 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all semiconductor structures. The substrate 201 may also be made of materials other than silicon.

At the point of fabrication depicted in FIG. 2A, the transistor 200 includes a schematically depicted gate structure 203 that typically includes an illustrative gate insulation layer 205 and an illustrative gate electrode 204. The gate insulation layer 205 may include a variety of different materials, such as, for example, silicon dioxide, a so-called high-k (k greater than 10) insulation material, etc. Similarly, the gate electrode 204 may also be of a material such as polysilicon or amorphous silicon, or it may include one or more metal layers that act as the gate electrode 204. As will be recognized by those skilled in the art after a complete reading of the present application, the gate structure 203 of the transistor 200 depicted in the drawings, i.e., the gate insulation layer 205 and the gate electrode 204, is intended to be representative in nature. That is, the gate structure 203 may include a variety of different materials and it may have a variety of configurations, and the gate structure 203 may be made manufactured using either so-called "gate-first" or "replacement-gate" processing techniques. For ease of explanation, the illustrative transistor 200 will be depicted as having a polysilicon gate electrode 204, however, the present invention should not be considered as limited to such an illustrative embodiment.

With continuing reference to FIG. 2A, also depicted are a gate cap layer 206, e.g., silicon nitride, and so-called extension implant regions 208. The extension implant regions 208 are formed in the substrate 201 by performing an ion implantation process through a photoresist mask (not shown), i.e., by implanting an N-type dopant for the NMOS transistor 200. Although not depicted in the drawings, at the point of fabrication depicted in FIG. 2A, so-called halo implant regions (not shown) have been formed in the substrate 201 typically by performing an angled ion implant process (with a P-type dopant for an NMOS transistor). The various structures and regions of the transistor 200 depicted in FIG. 2A may be formed by performing well-known processes. For example, the gate structure 203 may be formed by depositing various layers of material and thereafter performing one or more etching processes to define the basic layer stack of the gate structure 203 as well as the gate cap layer 206.

Figure 2B:
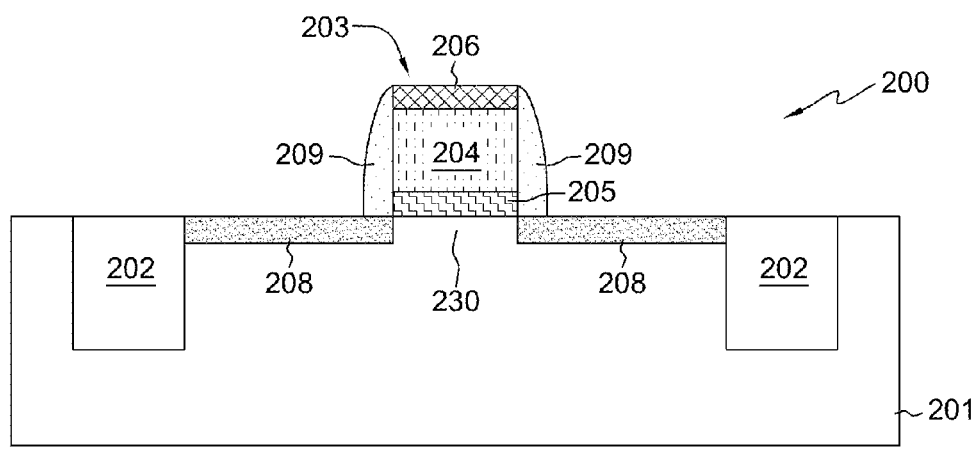

Thus, with reference to FIGS. 2A and 2B, the disclosed methods may include performing an extension ion implantation process 207 by implanting an extension dopant material into the substrate 201 to thereby form a doped extension implant region 208 in the substrate 201, the doped extension implant region 208 separated by the channel region 230; and performing an extension dopant activation anneal process to activate the extension dopant material. The extension dopant material may be selected from a group that includes germanium, carbon, arsenic, phosphorus, antimony, and any mixtures thereof. Next, sidewall spacers 209 may be formed adjacent the gate structure 203. The sidewall spacers 209 may be formed by depositing a layer of spacer material, for example, silicon nitride, and thereafter performing an anisotropic etching process on the layer of spacer material so as to result in spacers 209 depicted in FIG. 2B. The base thickness or width of the spacer 209 may vary depending upon the particular application.

Various stress memorization methods are described below with reference to FIGS. 3A-7F. Prior to performing the steps of these stress memorization methods, the disclosed herein methods may further include performing an extension ion implantation process 207 as described above with reference to FIGS. 2A and 2B.

Figure 3A:
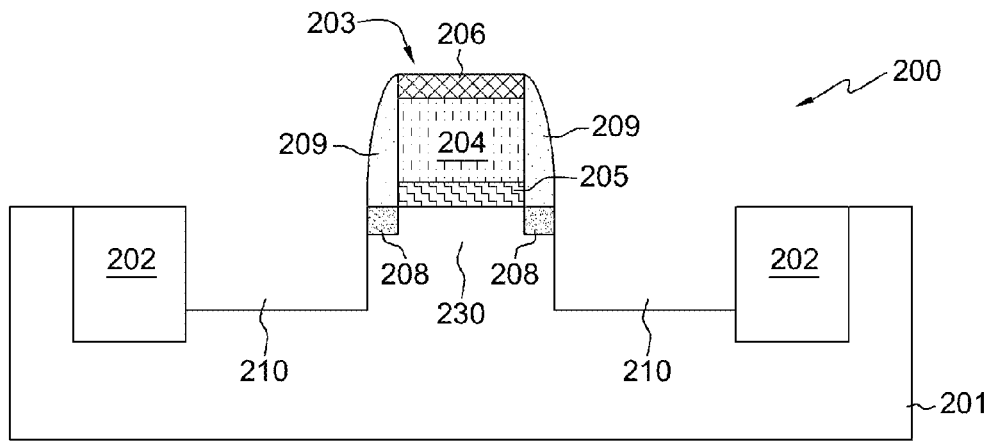
FIGS. 3A-3H depict, in idealized cross-section, an illustrative embodiment of a stress memorization technique that may be employed when manufacturing NMOS transistor devices in accordance with the disclosure provided herein.
Figure 3B:
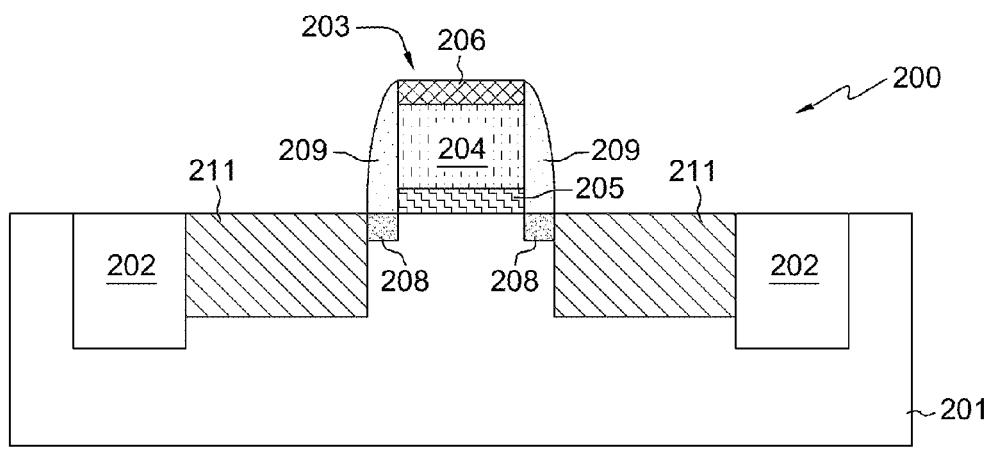
Figure 3C:
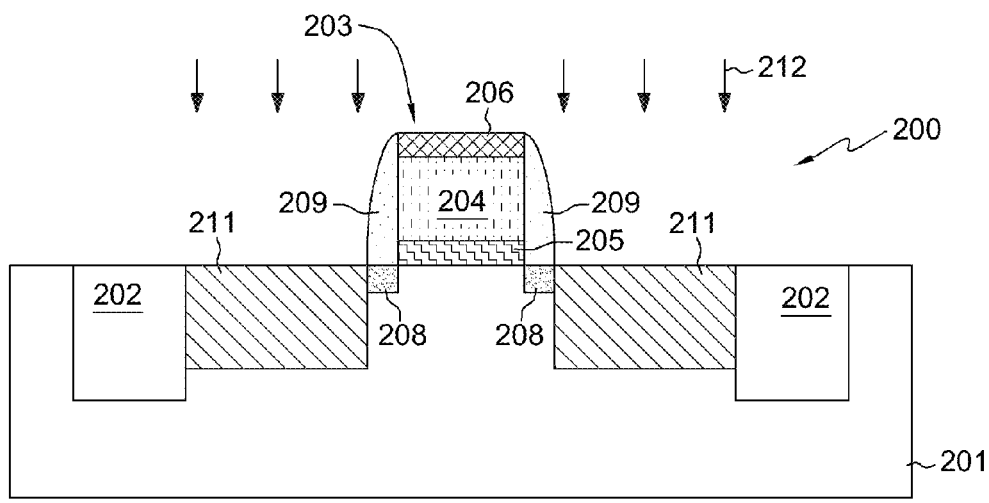
Figure 3D:
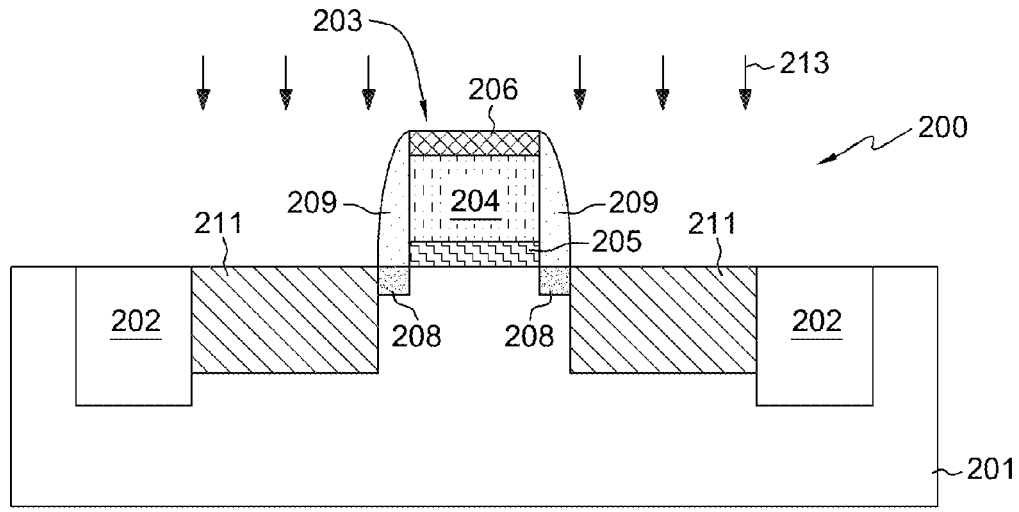
Figure 3E:
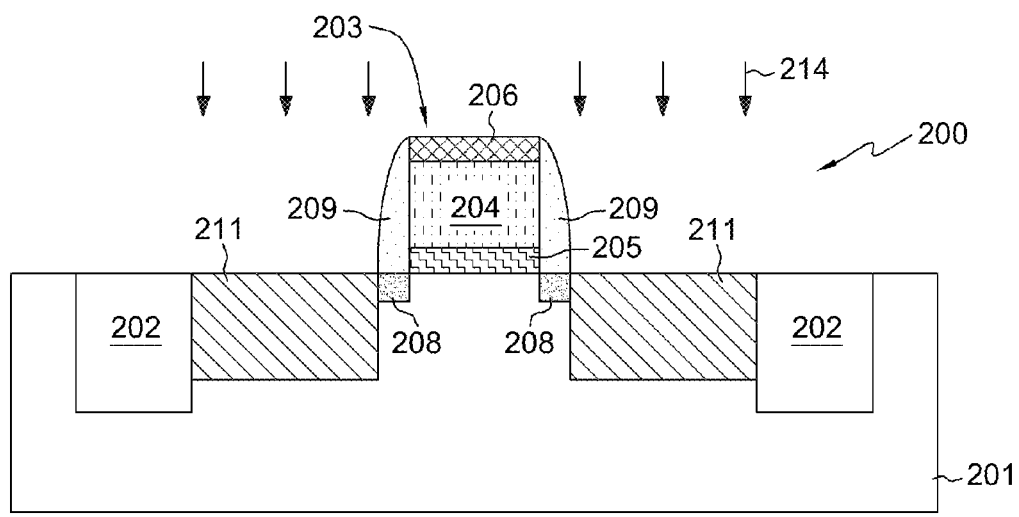
Figure 3F:
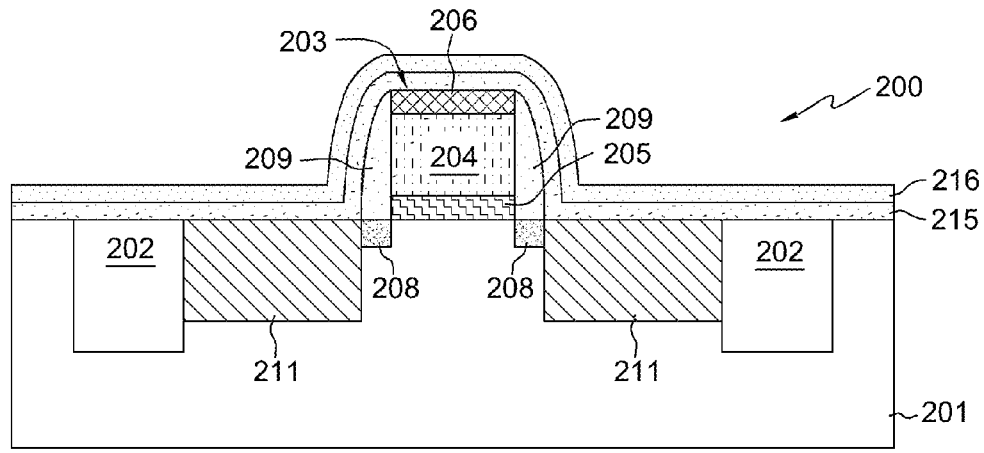
Figure 3G:
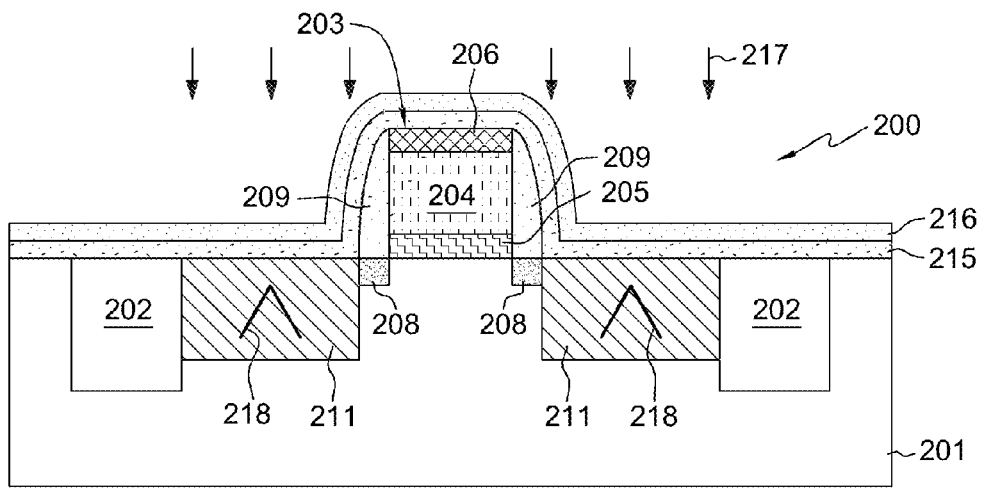
Figure 3H:
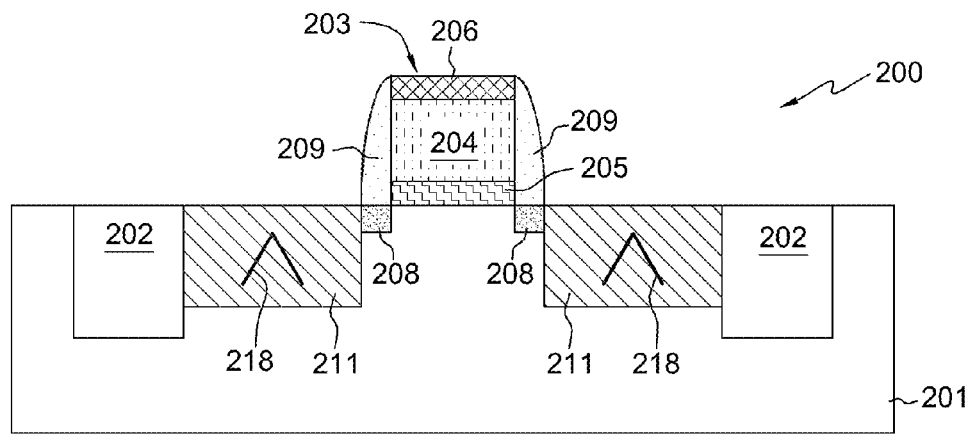

With reference to FIGS. 3A-3H, in one embodiment, the present disclosure is directed to a method which includes: fabricating an NMOS transistor device 200 which includes a substrate 201 and a gate structure 203 disposed over the substrate 201, the substrate 201 including a channel region 230 underlying, at least partially, the gate structure 203, the fabricating including:

forming a source and drain cavity 210 in the substrate 201, wherein the source and drain cavity 210 is separated by the channel region 230, as shown in FIG. 3A;

epitaxially growing a source and drain region 211 within the source and drain cavity 210, as shown in FIG. 3B;

performing a source and drain ion implantation process 212 by implanting a source and drain dopant material into the source and drain region 211, as shown in FIG. 3C, and performing a carbon implantation process 213 by implanting carbon into the source and drain region 211, as shown in FIG. 3D; wherein the source and drain ion implantation process 212 and the carbon implantation process 213 are performed sequentially or concurrently;

performing an amorphization ion implantation process 214 by implanting an amorphization ion material into the source and drain region 211, as shown in FIG. 3E;

forming a capping material layer 216 above the NMOS transistor device 200, as shown in FIG. 3F;

with the capping material layer 216 in position, performing a multipurpose anneal process 217 to thereby activate the source and drain dopant material and to form stacking faults 218 in the source and drain region 211, as shown in FIG. 3G; and removing the capping material layer 216, with the resulting NMOS transistor device depicted in FIG. 3H.

In one embodiment, the source and drain region 211 is a raised source and drain region.

In the above described method, prior to forming the source and drain cavity 210, the method may further include performing an extension ion implantation process 207 as described above with reference to FIGS. 2A and 2B.

Figure 4A:
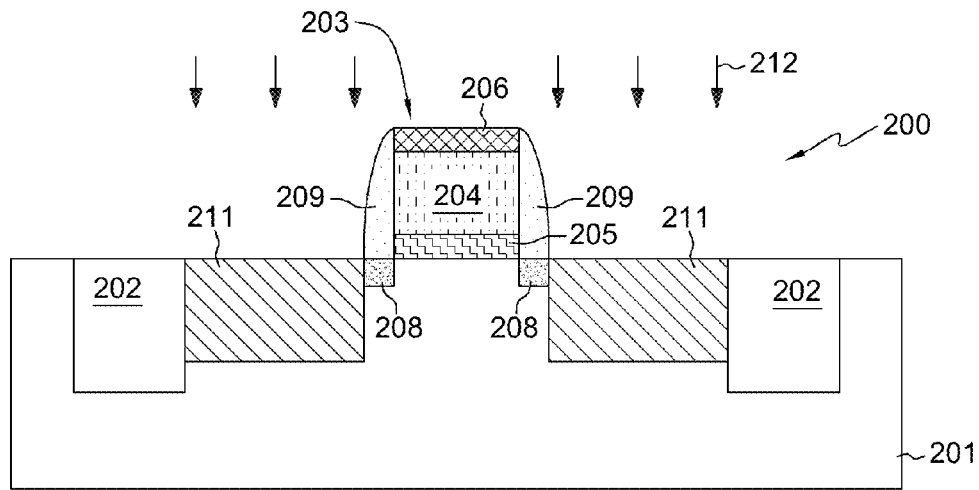
FIGS. 4A-4F depict, in idealized cross-section, another illustrative embodiment of a stress memorization technique that may be employed when manufacturing NMOS transistor devices in accordance with the disclosure provided herein.
Figure 4B:
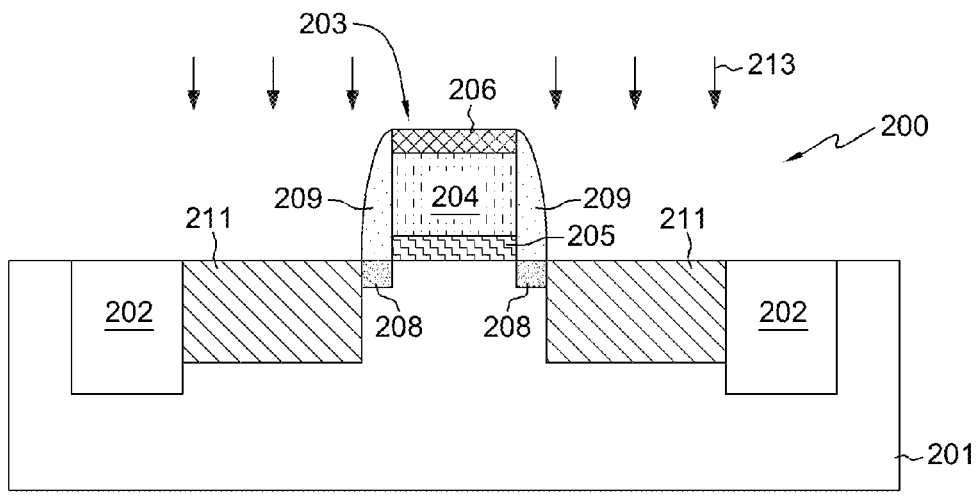
Figure 4C:
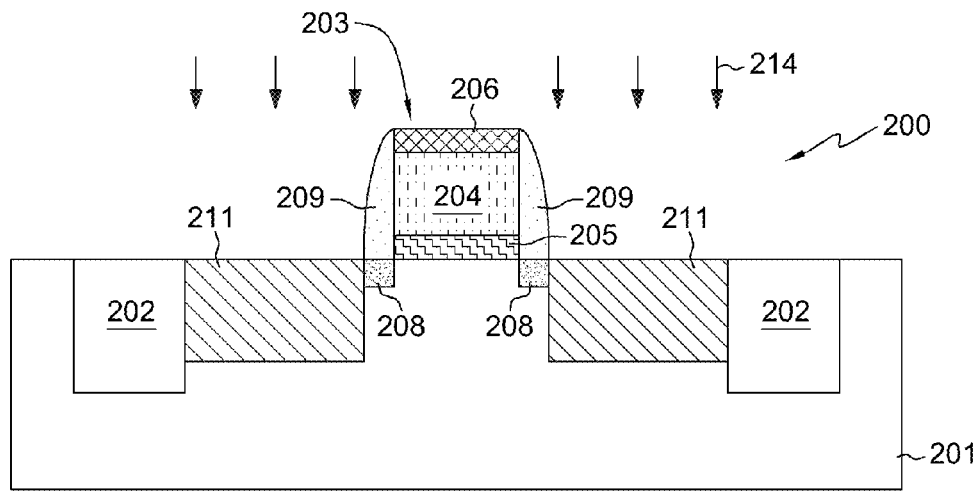
Figure 4D:
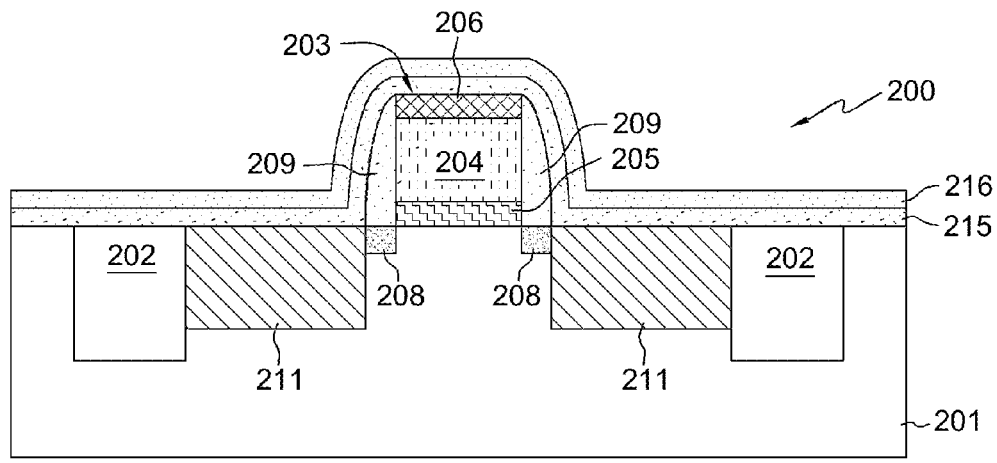
Figure 4E:
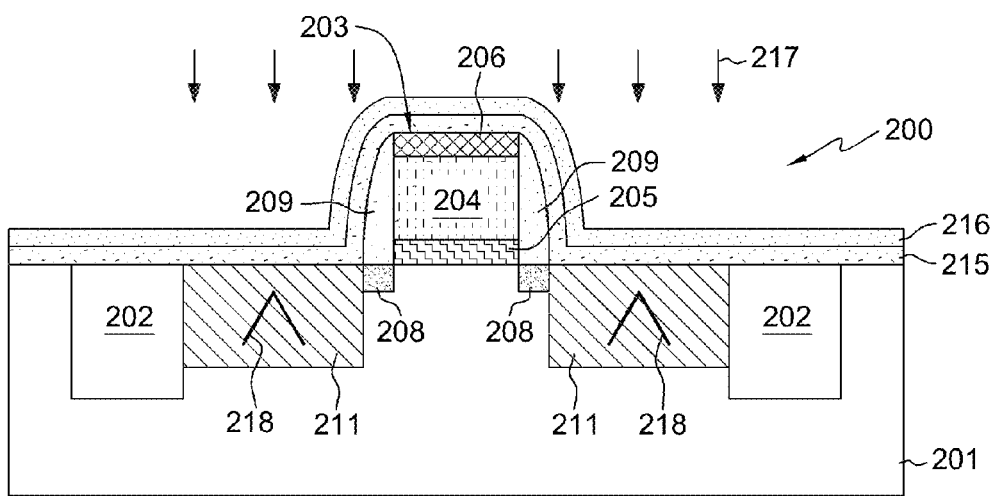
Figure 4F:
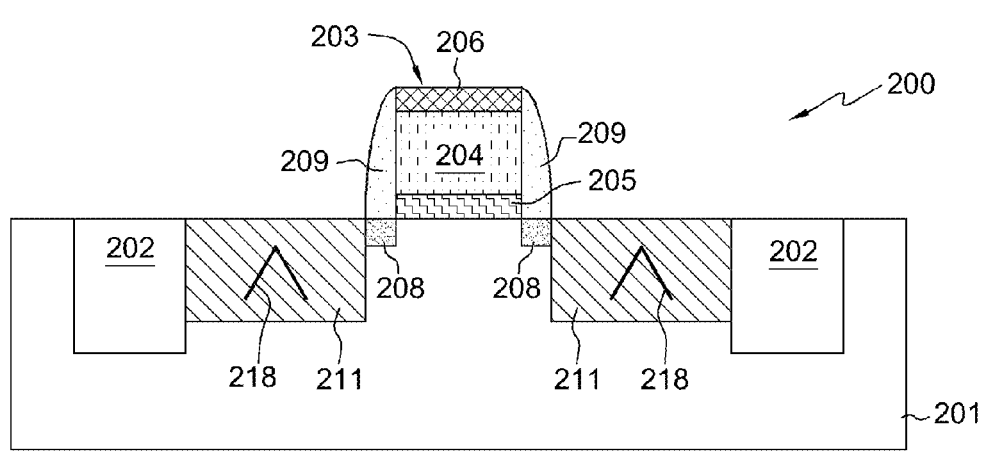

In another embodiment, with reference to FIGS. 4A-4F, the disclosed method includes: fabricating an NMOS transistor device 200 including a substrate 201 and a gate structure 203 disposed over the substrate 201, the substrate 201 including a channel region 230 underlying, at least partially, the gate structure 203, the fabricating including:

performing a source and drain ion implantation process 212 by implanting a source and drain dopant material into a source and drain region 211, wherein the source and drain region 211 is separated by the channel region 230, as shown in FIG. 4A, and performing a carbon implantation process 213 by implanting carbon into the source and drain region 211, as shown in FIG. 4B; wherein the source and drain ion implantation process 212 and the carbon implantation process 213 are performed sequentially or concurrently;

performing an amorphization ion implantation process 214 by implanting an amorphization ion material into the source and drain region 211, as shown in FIG. 4C;

forming a capping material layer 216 above the NMOS transistor device 200, as shown in FIG. 4D;

with the capping material layer 216 in position, performing a multipurpose anneal process 217 to thereby activate the source and drain dopant material and to form stacking faults 218 in the source and drain region 211, as shown in FIG. 4E; and removing the capping material layer 216, with the resulting NMOS transistor device depicted in FIG. 4F.

In one embodiment, the source and drain dopant material may be selected from the group which includes germanium, carbon, arsenic, phosphorus, antimony and mixtures thereof. In one embodiment, the amorphization ion material may be selected from the group which includes germanium, carbon, silicon, arsenic, antimony, and mixtures thereof.

In the above described method, prior to performing the source and drain ion implantation process 212, the method may further include performing an extension ion implantation process 207 as described above with reference to FIGS. 2A and 2B.

Figure 5A:
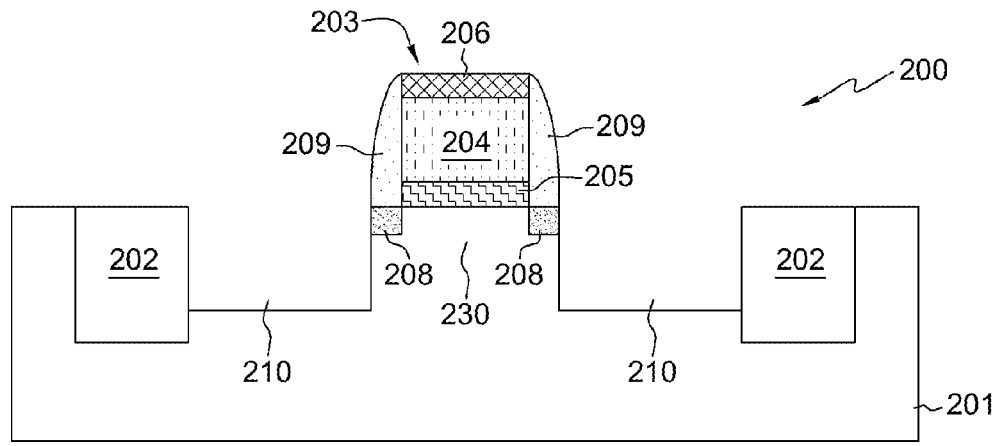
FIGS. 5A-5I depict, in idealized cross-section, another illustrative embodiment of a stress memorization technique that may be employed when manufacturing NMOS transistor devices in accordance with the disclosure provided herein.
Figure 5B:
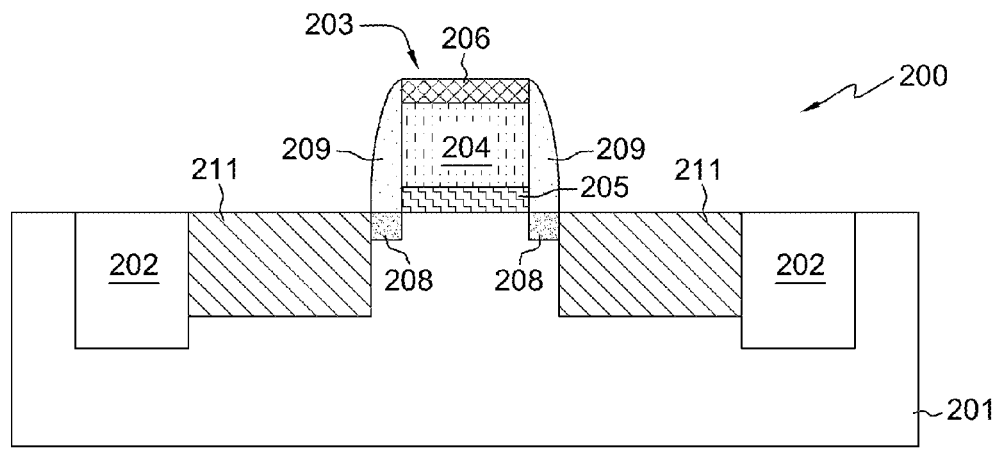
Figure 5C:
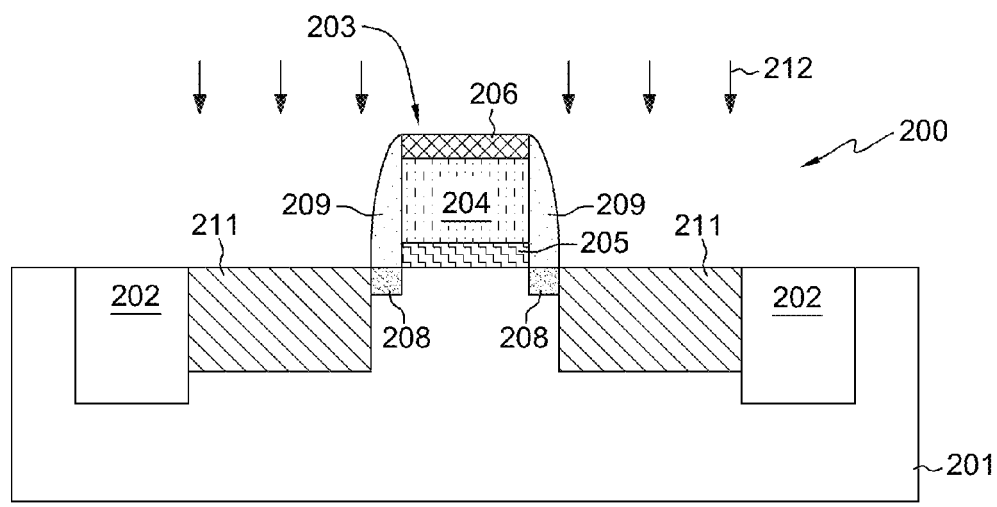
Figure 5D:
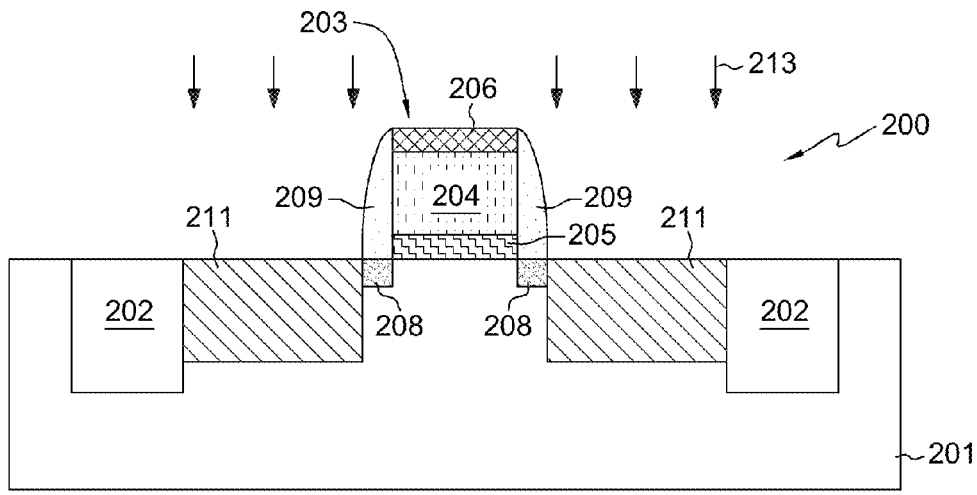
Figure 5E:
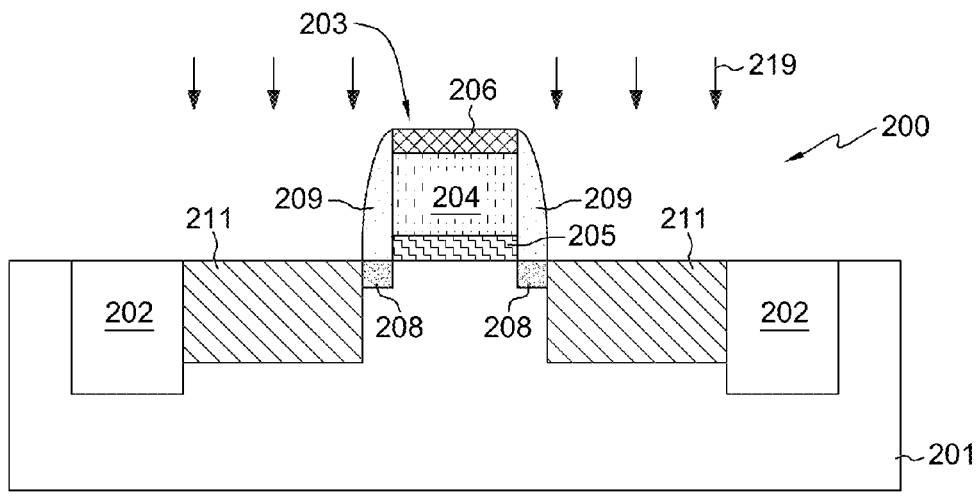
Figure 5F:
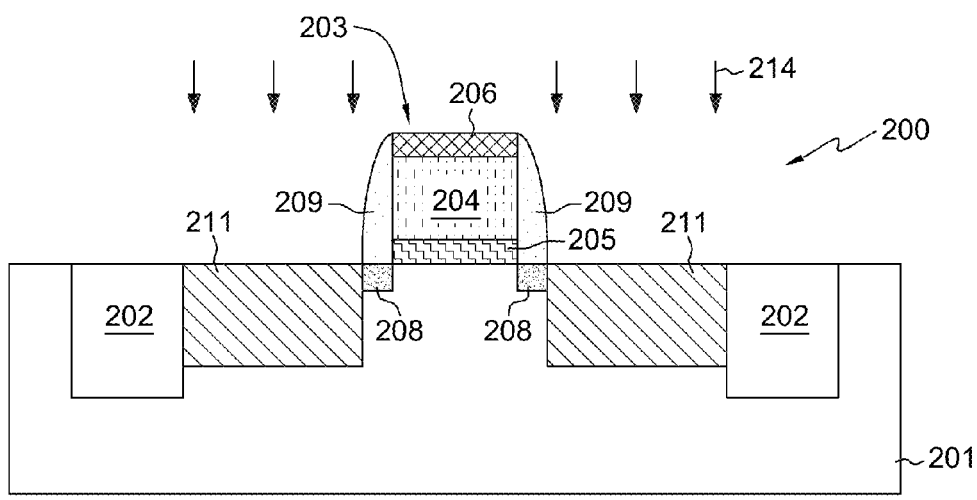
Figure 5G:
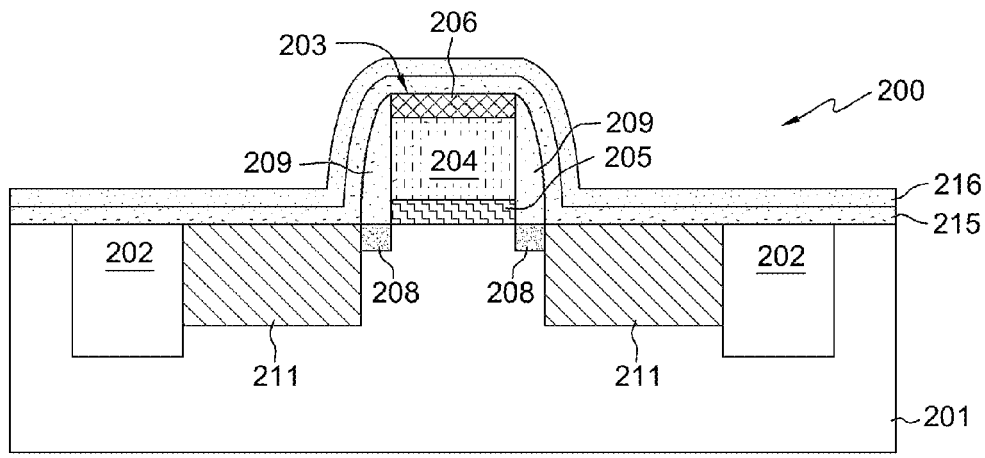
Figure 5H:
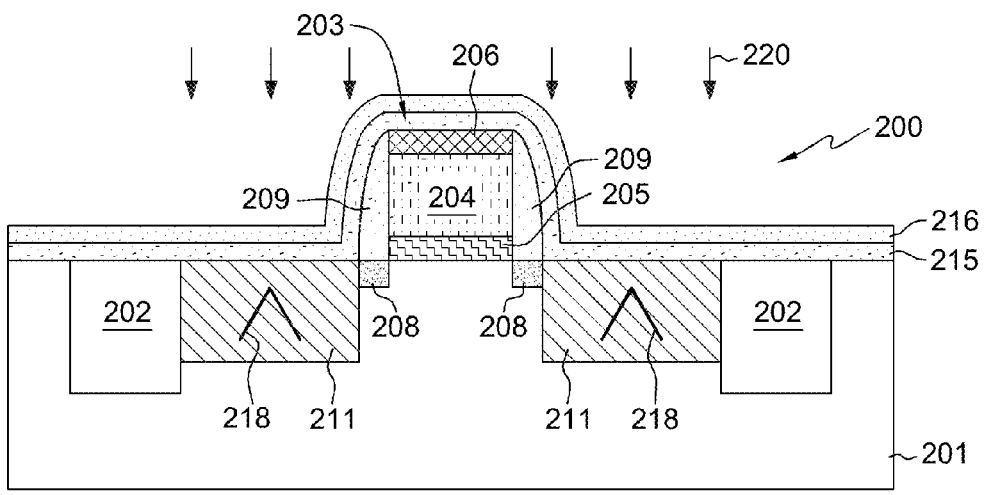
Figure 5I:
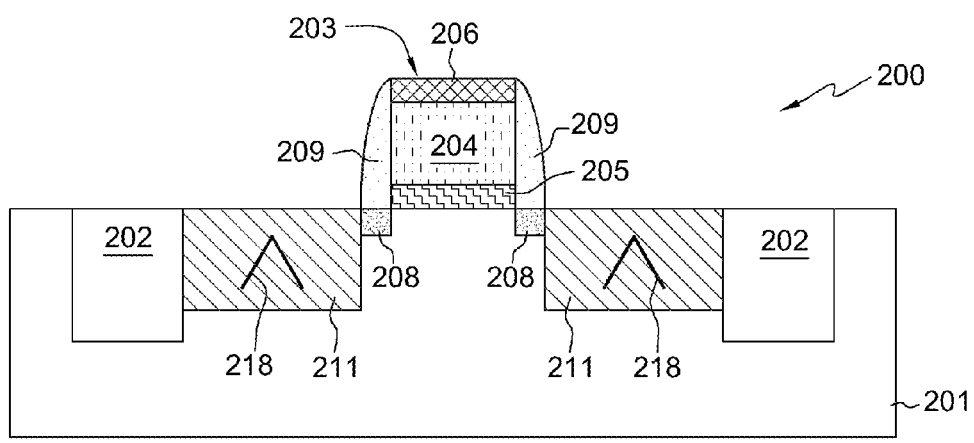

In another embodiment, with reference to FIGS. 5A-5I, the disclosed method includes: fabricating an NMOS transistor device 200 including a substrate 201 and a gate structure 203 disposed over the substrate 201, the substrate 201 including a channel region 230 underlying, at least partially, the gate structure 203, the fabricating including:

forming a source and drain cavity 210 in the substrate 201, wherein the source and drain cavity 210 is separated by the channel region 230, as shown in FIG. 5A;

epitaxially growing a source and drain region 211 within the source and drain cavity 210, as shown in FIG. 5B;

performing a source and drain ion implantation process 212 by implanting a source and drain dopant material into the source and drain region 211, as shown in FIG. 5C, and performing a carbon implantation process 213 by implanting carbon into the source and drain region 211, as shown in FIG. 5D; wherein the source and drain ion implantation process 212 and the carbon implantation process 213 are performed sequentially or concurrently;

performing a source and drain activation anneal process 219 to activate the source and drain dopant material, as shown in FIG. 5E;

performing an amorphization ion implantation process 214 by implanting an amorphization ion material into the source and drain region 211, as shown in FIG. 5F;

forming a capping material layer 216 above the NMOS transistor device 200, as shown in FIG. 5G;

with the capping material layer 216 in position, performing a stress forming anneal process 220 to thereby form stacking faults 218 in the source and drain region 211, as shown in FIG. 5H; and removing the capping material layer 216, with the resulting NMOS transistor device depicted in FIG. 5I.

In one embodiment, the source and drain region is a raised source and drain region. In one embodiment, the source and drain dopant material may be selected from the group which includes germanium, carbon, arsenic, phosphorus, antimony, and mixtures thereof. In one embodiment, the amorphization ion material is selected from the group which includes germanium, carbon, silicon, arsenic, antimony, and mixtures thereof.

In one embodiment, subsequent to performing the source and drain activation anneal process 219 and prior to performing the amorphization ion implantation process 214, performing a supplementary carbon implantation process by implanting carbon into the source and drain region 211.

In the above described method, prior to forming the source and drain cavity 210, the method may further include performing an extension ion implantation process 207 as described above with reference to FIGS. 2A and 2B.

Figure 6A:
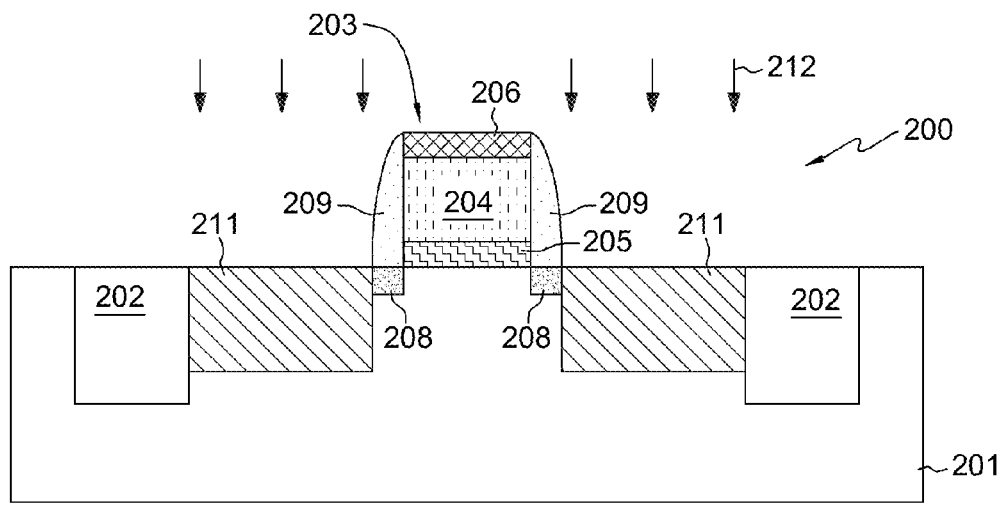
FIGS. 6A-6G depict, in idealized cross-section, another illustrative embodiment of a stress memorization technique that may be employed when manufacturing NMOS transistor devices in accordance with the disclosure provided herein.
Figure 6B:
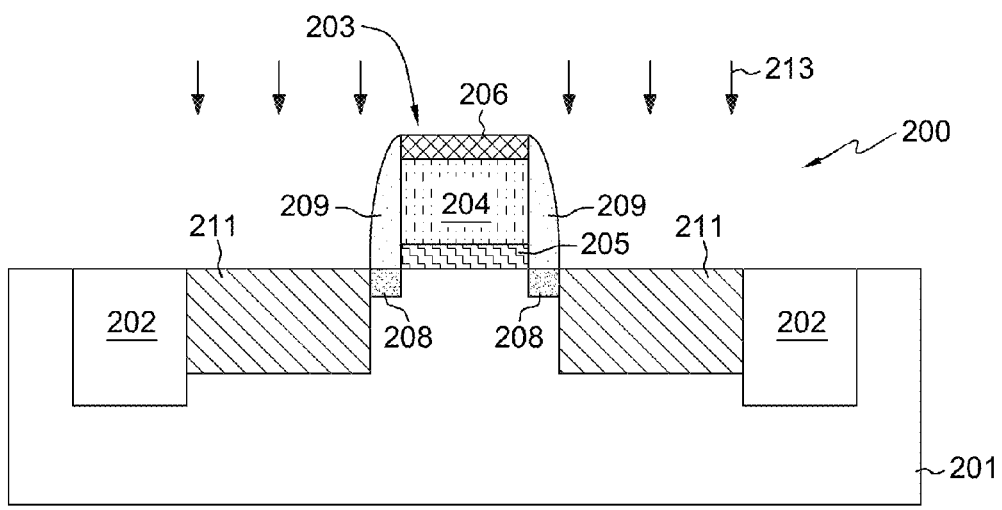
Figure 6C:
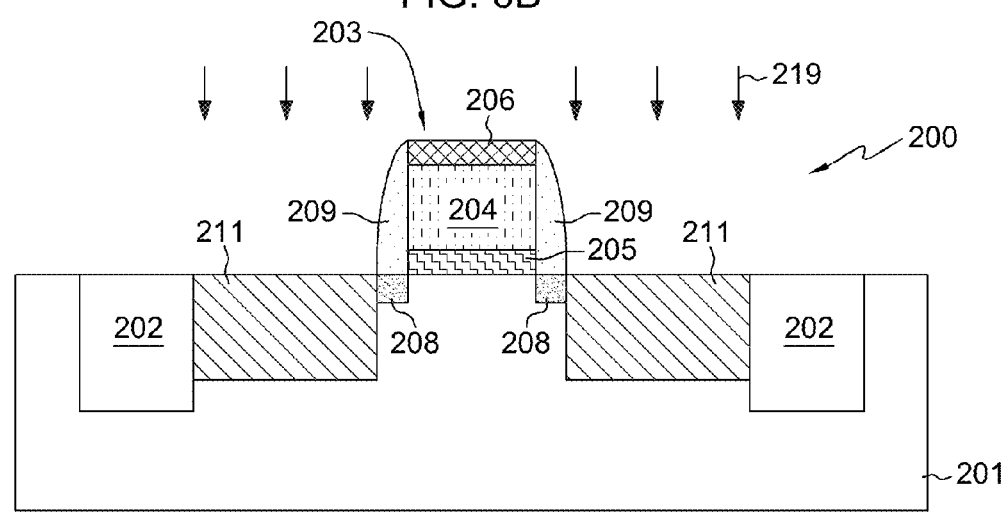
Figure 6D:
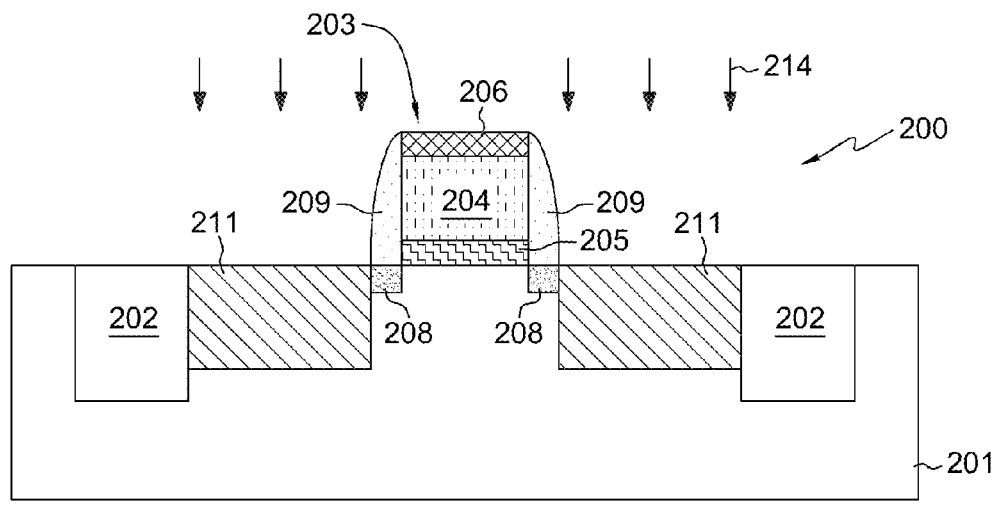
Figure 6E:
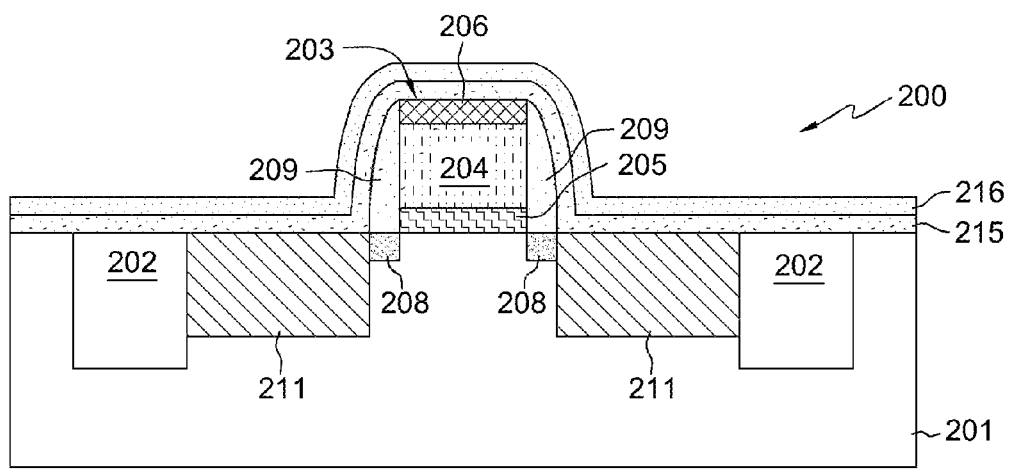
Figure 6F:
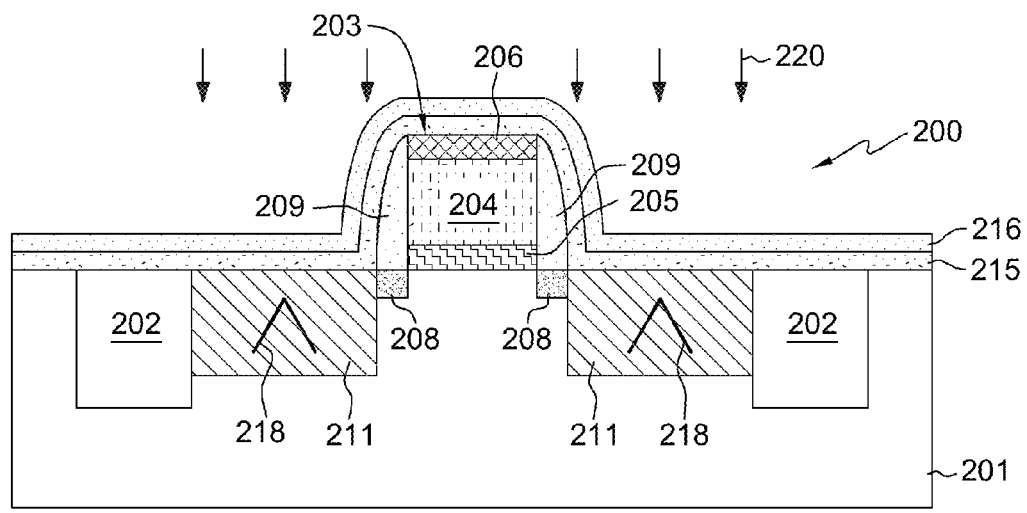
Figure 6G:
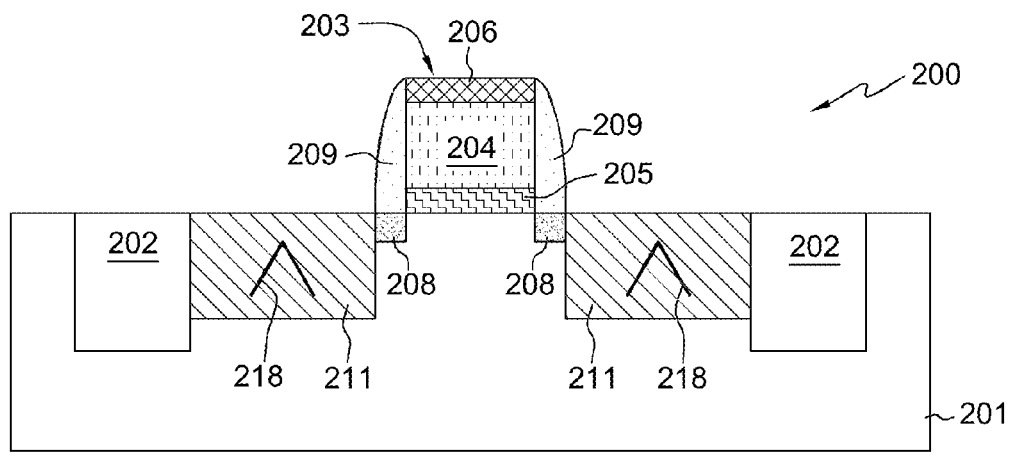

In another embodiment, with reference to FIGS. 6A-6G, the disclosed method includes: fabricating an NMOS transistor device 200 including a substrate 201 and a gate structure 203 disposed over the substrate 201, the substrate 201 including a channel region 230 underlying, at least partially, the gate structure 203, the fabricating including:

performing a source and drain ion implantation process 212 by implanting a source and drain dopant material into a source and drain region 210, wherein the source and drain region is separated by the channel region 230, as shown in FIG. 6A, and performing a carbon implantation process 213 by implanting carbon into the source and drain region 211, as shown in FIG. 6B; wherein the source and drain ion implantation process 212 and the carbon implantation process 213 are performed sequentially or concurrently;

performing a source and drain activation anneal process 219 to activate the source and drain dopant material, as shown in FIG. 6C;

performing an amorphization ion implantation process 214 by implanting an amorphization ion material into the source and drain region 211, as shown in FIG. 6D;

forming a capping material layer 216 above the NMOS transistor device 200, as shown in FIG. 6E;

with the capping material layer 216 in position, performing a stress forming anneal process 220 to thereby form stacking faults 218 in the source and drain region 211, as shown in FIG. 6F; and removing the capping material layer 216, with the resulting NMOS transistor device depicted in FIG. 6G.

In one embodiment, the source and drain dopant material may be selected from the group which includes germanium, carbon, arsenic, phosphorus, antimony, and mixtures thereof. In one embodiment, the amorphization ion material may be selected from the group which includes germanium, carbon, silicon, arsenic, antimony, and mixtures thereof.

In one embodiment, the method of further includes: subsequent to performing the source and drain activation anneal process 219 and prior to performing the amorphization ion implantation process 214, performing a supplementary carbon implantation process by implanting carbon into the source and drain region 211.

In the above described method, prior to performing the source and drain ion implantation process 212, the method may further include performing an extension ion implantation process 207 as described above with reference to FIGS. 2A and 2B.

Figure 7A:
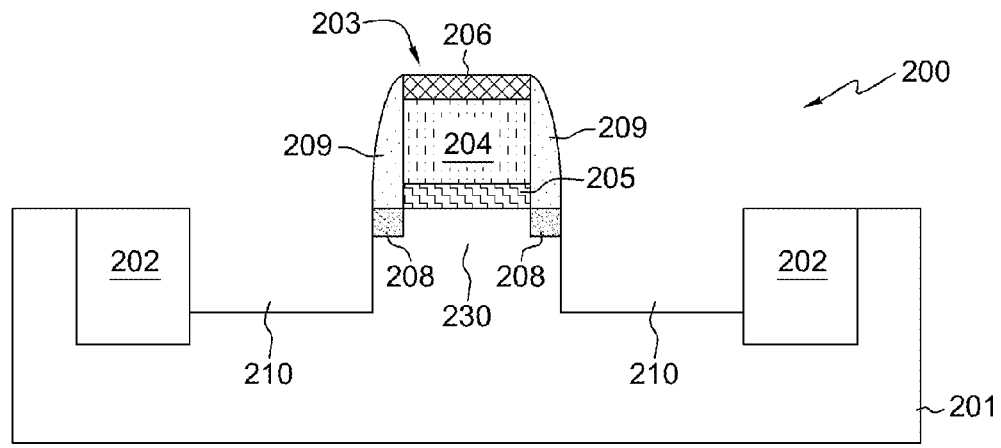
FIGS. 7A-7F depict, in idealized cross-section, another illustrative embodiment of a stress memorization technique that may be employed when manufacturing NMOS transistor devices in accordance with the disclosure provided herein.
Figure 7B:
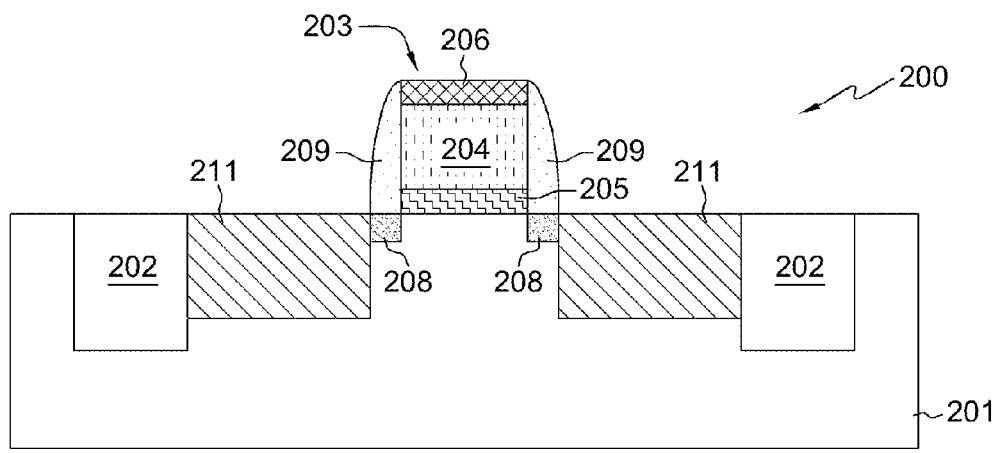
Figure 7C:
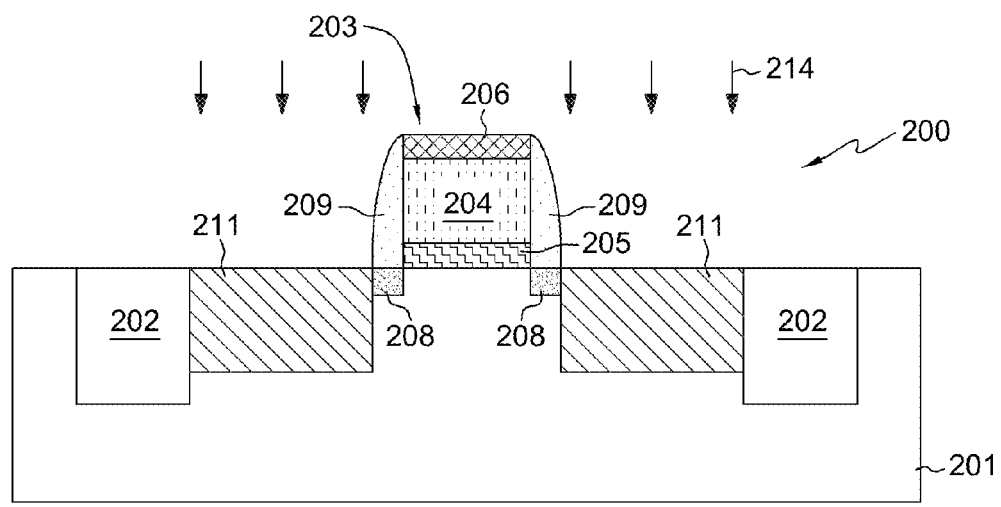
Figure 7D:
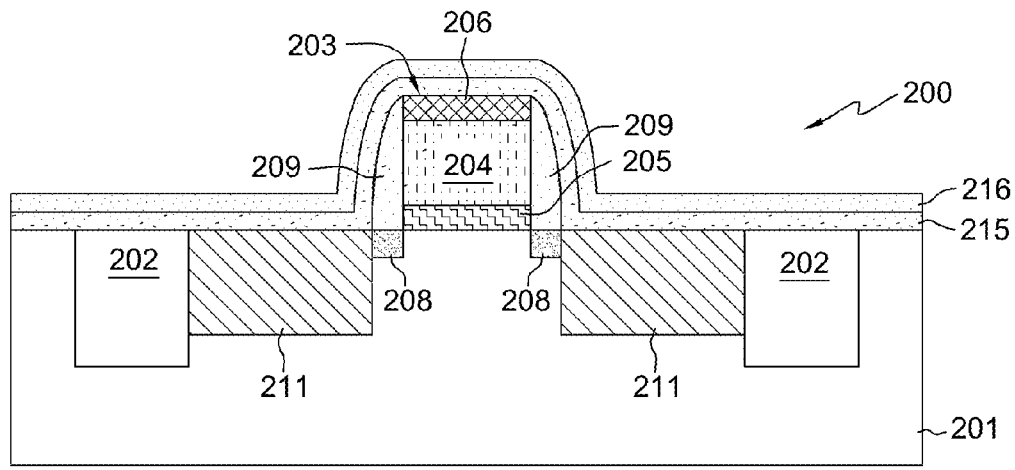
Figure 7E:
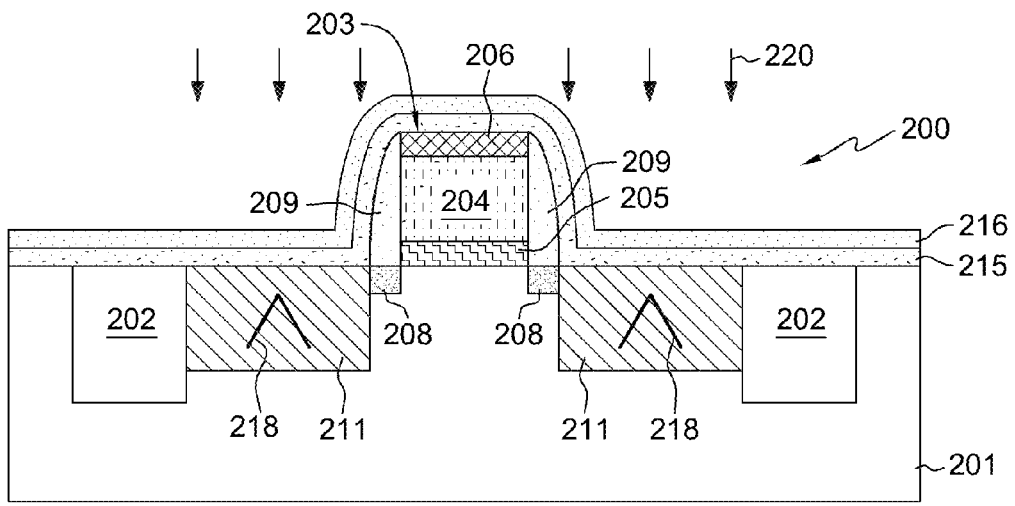
Figure 7F:
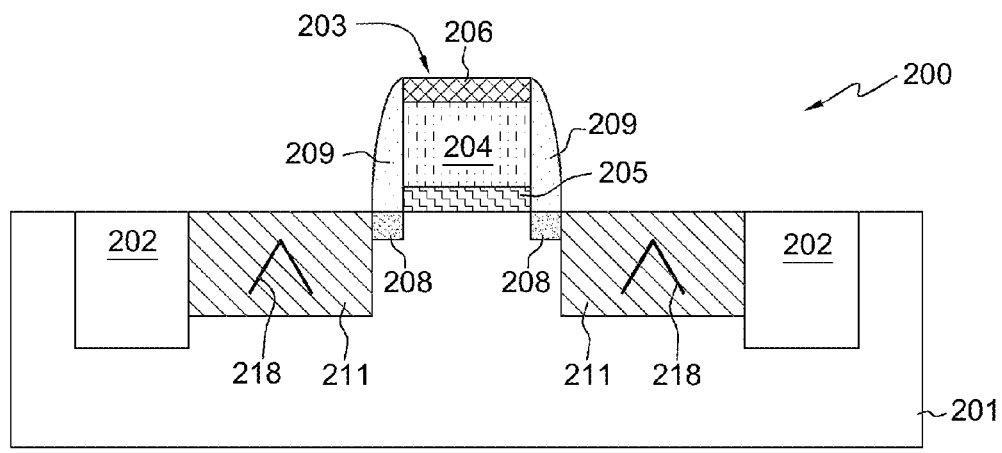

In another embodiment, with reference to FIGS. 7A-7F, the disclosed method includes: fabricating an NMOS transistor device 200 including a substrate 201 and a gate structure 203 disposed over the substrate 201, the substrate 201 including a channel region 230 underlying, at least partially, the gate structure 203, the fabricating including:

forming a source and drain cavity 210 in the substrate 201, wherein the source and drain cavity 210 is separated by the channel region 230, as shown in FIG. 7A;

with an in situ doped semiconductor material, epitaxially growing a source and drain region 211 within the source and drain cavity 210, as shown in FIG. 7B;

performing an amorphization ion implantation process 214 by implanting an amorphization ion material into the source and drain region 211, as shown in FIG. 7C;

forming a capping material layer 216 above the NMOS transistor device 200, as shown in FIG. 7D;

with the capping material layer 216 in position, performing a stress forming anneal process 220 to thereby form stacking faults 218 in the source and drain region 211, as shown in FIG. 7E; and removing the capping material layer 216, with the resulting NMOS transistor device depicted in FIG. 7F.

In one embodiment, the source and drain region is a raised source and drain region. In one embodiment, the in situ doped semiconductor material is doped with carbon, phosphorus, and mixtures thereof. In one embodiment, the amorphization ion material is selected from the group which includes germanium, carbon, silicon, arsenic, antimony, and mixtures thereof. In another embodiment, the amorphization ion material is silicon and/or germanium.

In the above described method, prior to forming the source and drain cavity 210, the method may further include performing an extension ion implantation process 207 as described above with reference to FIGS. 2A and 2B.

In yet another embodiment, with reference to FIGS. 7A-7F, the disclosed method includes: fabricating an NMOS transistor device 200 including a substrate 201 and a gate structure 203 disposed over the substrate 201, the substrate 201 including a channel region 230 underlying, at least partially, the gate structure 203, the fabricating including:

forming a source and drain cavity 210 in the substrate 201, wherein the source and drain cavity 210 is separated by the channel region 230, as shown in FIG. 7A;

with an in situ doped semiconductor material, epitaxially growing a source and drain region 211 within the source and drain cavity 210, as shown in FIG. 7B;

performing an amorphization ion implantation process 214 by implanting an amorphization ion material into the source and drain region 211, as shown in FIG. 7C, wherein the amorphization ion material is silicon and/or germanium;

forming a capping material layer 216 above the NMOS transistor device 200, as shown in FIG. 7D;

with the capping material layer 216 in position, performing a stress forming anneal process 220 to thereby form stacking faults 218 in the source and drain region 211, as shown in FIG. 7E; and removing the capping material layer 216, with the resulting NMOS transistor device depicted in FIG. 7F.

In one embodiment, the source and drain region is a raised source and drain region. In one embodiment, the in situ doped semiconductor material is doped with carbon, phosphorus, and mixtures thereof.

In the above described method, prior to forming the source and drain cavity 210, the method may further include performing an extension ion implantation process 207 as described above with reference to FIGS. 2A and 2B.

With respect to the methods described herein, the implant energy and implant dose of the extension ion implantation process 207 may vary depending upon the application and the selected process flow. For example, the extension ion implantation process 207 may be performed using an implant energy that falls within the range of about 1 keV to about 90 keV and a dose of the extension dopant material may fall within the range of about $1.0E13$ ions/cm$^2$ to about $5.0E15$ ions/cm$^2$. The extension dopant material may be selected from the group that includes germanium, carbon, arsenic, phosphorus, antimony and mixtures thereof.

With respect to the methods described herein, the implant energy and implant dose of the source and drain ion implantation process 212 may vary depending upon the application and the selected process flow. For example, the source and drain ion implantation process 212 may be performed using an implant energy that falls within the range of about 0.1 keV to about 50 keV and a dose of the source and drain dopant material may fall within the range of about $1.0E13$ ions/cm$^2$ to about $9.9E15$ ions/cm$^2$. The source and drain dopant material may be selected from the group that includes germanium, carbon, arsenic, phosphorus, antimony and mixtures thereof.

With respect to the methods described herein, the implant energy and implant dose of the carbon implantation process 213 may vary depending upon the application and the selected process flow. For example, the carbon implantation process 213 may be performed using an implant energy that falls within the range of about 1 keV to about 50 keV and a dose of the carbon may fall within the range of about $1.0E13$ ions/cm$^2$ to about $5.0E15$ ions/cm$^2$.

With respect to the methods described herein, the implant energy and implant dose of the supplementary carbon implantation process may vary depending upon the application and the selected process flow. For example, the supplementary carbon implantation process may be performed using an implant energy that falls within the range of about 1 keV to about 50 keV and a dose of the carbon may fall within the range of about $1.0E13$ ions/cm$^2$ to about $5.0E15$ ions/cm$^2$.

With respect to the methods described herein, the implant energy and implant dose of the amorphization ion implantation process 214 may vary depending upon the application and the selected process flow. For example, the amorphization ion implantation process 214 may be performed using an implant energy that falls within the range of about 10 keV to about 90 keV and a dose of the amorphization ion material may fall within the range of about $1.0E14$ ions/cm$^2$ to about $9.9E15$ ions/cm$^2$. In one embodiment, the amorphization ion material is selected from the group consisting of germanium, carbon, silicon, arsenic, antimony, and mixtures thereof.

With respect to the methods described herein, the extension dopant activation anneal process may be performed in an inert ambient (e.g., N$_2$) at a temperature that falls within the range of from about 600° C. to about 800° C. The duration of such extension dopant activation anneal process may be about 10 minutes. In another embodiment, the extension dopant activation anneal process may be a rapid thermal spike anneal process performed in an inert ambient at a temperature that falls within the range of from about 950° C. to about 1050° C. The extension dopant activation anneal process activates the implanted extension dopant materials.

With respect to the methods described herein, the multipurpose anneal process 217 may be performed in an inert ambient (e.g., N$_2$) at a temperature that falls within the range of from about 600° C. to about 800° C. The duration of such multipurpose anneal process 217 may be about 10 minutes. In another embodiment, the multipurpose anneal process 217 may be a rapid thermal spike anneal process performed in an inert ambient at a temperature that falls within the range of from about 950° C. to about 1050° C. The multipurpose anneal process simultaneously activates the implanted source and drain dopant materials and forms staking faults 218.

With respect to the methods described herein, the source and drain activation anneal process 219 may be performed in an inert ambient (e.g., N$_2$) at a temperature that falls within the range of from about 600° C. to about 800° C. The duration of such source and drain activation anneal process 219 may be about 10 minutes. In another embodiment, the source and drain activation anneal process 219 may be a rapid thermal spike anneal process performed in an inert ambient at a temperature that falls within the range of from about 950° C. to about 1050° C. The source and drain activation anneal process activates the implanted source and drain dopant materials.

With respect to the methods described herein, the stress forming anneal process 220 may be performed in an inert ambient (e.g., N$_2$) at a temperature that falls within the range of from about 600° C. to about 800° C. The duration of such stress forming anneal process 220 may be about 10 minutes. In another embodiment, the stress forming anneal process 220 may be a rapid thermal spike anneal process performed in an inert ambient at a temperature that falls within the range of from about 950° C. to about 1050° C. The stress forming anneal process forms staking faults 218.

In any of the described embodiments, the gate structure 203 may include a high-k gate insulation layer and a gate electrode, wherein the gate electrode includes at least one layer of metal. In another embodiment, the gate structure may include a silicon dioxide gate insulation layer and a gate electrode, wherein the gate electrode includes a layer of polysilicon.

When forming a capping material layer 216 above the NMOS transistor device 200 in any of the described embodiments, a thin (about 2-4 nm) liner layer 215 may be conformably deposited on the device 200 by performing a CVD or an ALD process. The liner layer 215 may be composed of silicon dioxide. Thereafter, the capping material layer 216 may be formed above the transistor 200. The capping material layer 216 may include a material such as silicon nitride and it may have a thickness of about 20-80 nm. The capping material layer 216 may be formed with or without any intrinsic stress.

Accordingly, in any of the described embodiments, the capping material layer 216 may include silicon nitride. In another embodiment, the capping material layer 216 may include a layer of silicon nitride deposited over a layer of silicon oxide.

With respect to all of the described embodiments, after removal of the capping material layer, additional processing operations may be performed to incorporate the device into an integrated circuit, e.g., the formation of source/drain contacts, the formation of a gate contact, and the formation of various metallization layers above the device 200.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method comprising:
    fabricating an NMOS transistor device comprising a substrate and a gate structure disposed over the substrate, the substrate comprising a channel region underlying, at least partially, the gate structure, the fabricating comprising:
        forming a source and drain cavity in the substrate, wherein the source and drain cavity is separated by the channel region;
        epitaxially growing, following forming the source and drain cavity, a source and drain region within the source and drain cavity;
        performing a source and drain ion implantation process, following the epitaxially growing, by implanting a source and drain dopant material into the source and drain region and performing a carbon implantation process by implanting carbon into the source and drain region; wherein the source and drain ion implantation process and the carbon implantation process are performed concurrently;
        performing, following the source and drain ion implantation process and carbon implantation process, an amorphization ion implantation process by implanting an amorphization ion material into the source and drain region;
        forming, following the amorphization ion implantation process, a capping material layer above the NMOS transistor device;
        with the capping material layer in position, performing a multipurpose anneal process to thereby activate the source and drain dopant material and to form stacking faults in the source and drain region; and
        removing the capping material layer following the forming of a capping material layer.

2. The method of claim 1, wherein the source and drain dopant material is selected from the group consisting of germanium, carbon, arsenic, phosphorus, antimony and mixtures thereof.

3. The method of claim 1, wherein the amorphization ion material is selected from the group consisting of germanium, carbon, silicon, arsenic, antimony, and mixtures thereof.

4. The method of claim 1, further comprising:
- prior to forming the source and drain cavity in the substrate, performing an extension ion implantation process by implanting an extension dopant material into the substrate to thereby form a doped extension implant region in the substrate, the doped extension implant region separated by the channel region; and
- performing an extension dopant activation anneal process to activate the extension dopant material.

5. The method of claim 4, wherein the extension dopant material is selected from the group consisting of germanium, carbon, arsenic, phosphorus, antimony, and mixtures thereof.

* * * * *